(12) United States Patent
Hartner et al.

(10) Patent No.: US 6,438,019 B2
(45) Date of Patent: Aug. 20, 2002

(54) FERROELECTRIC RANDOM ACCESS MEMORY (FERAM) HAVING STORAGE CAPACITORS WITH DIFFERENT COERCIVE VOLTAGES

(75) Inventors: Walter Hartner; Günther Schindler; Frank Hintermaier, all of München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/756,085

(22) Filed: Jan. 8, 2001

Related U.S. Application Data

(63) Continuation of application No. PCT/DE99/01905, filed on Jul. 1, 1999.

(51) Int. Cl.$^7$ ................................ G11C 11/02
(52) U.S. Cl. .................. 365/133; 365/145; 257/295
(58) Field of Search ...................... 365/145, 132, 365/133; 257/295

(56) References Cited

U.S. PATENT DOCUMENTS

| | | | |
|---|---|---|---|
| 5,155,573 A | 10/1992 | Abe et al. | 257/304 |
| 5,189,594 A | 2/1993 | Hoshiba | 257/295 |
| 5,291,436 A | 3/1994 | Kamisawa | 365/145 |
| 5,400,275 A * | 3/1995 | Abe et al. | 365/145 |
| 5,495,438 A | 2/1996 | Omura | 365/145 |
| 5,572,459 A * | 11/1996 | Wilson et al. | 365/145 |
| 5,822,237 A * | 10/1998 | Wilson et al. | 365/145 |
| 5,822,240 A * | 10/1998 | Yoo | 365/145 |
| 6,028,782 A * | 2/2000 | Hirano et al. | 365/145 |

FOREIGN PATENT DOCUMENTS

| | | | |
|---|---|---|---|
| EP | 0 720 172 A2 | 7/1996 | G11C/11/22 |
| JP | 7-22595 | 1/1995 | H01L/27/108 |
| JP | 10-93030 | 4/1998 | H01L/27/10 |

* cited by examiner

*Primary Examiner*—Andrew Q. Tran
(74) *Attorney, Agent, or Firm*—Laurence A. Greenberg; Werner J. Stemer; Gregory L. Mayback

(57) ABSTRACT

The invention relates to a ferroelectric RAM configuration, including a number of storage cells, each of which has a selection transistor and a capacitor device with a ferroelectric dielectric. The capacitor device includes at least two capacitors whose coercive voltages are different from each other.

12 Claims, 2 Drawing Sheets

FERROELECTRIC RANDOM ACCESS MEMORY (FERAM) HAVING STORAGE CAPACITORS WITH DIFFERENT COERCIVE VOLTAGES

CROSS-REFERENCE TO RELATED APPLICATION

This is a continuation of copending International Application PCT/DE99/01905, filed Jul. 1, 1999, which designated the United States.

BACKGROUND OF THE INVENTION

Field of the Invention

The present invention relates to an FeRAM (ferroelectric random access memory) configuration having a multiplicity of memory cells, each of which has a selection transistor and a capacitor device with a ferroelectric dielectric.

As is known, in FeRAM configurations information is stored by polarization in the ferroelectric dielectric of the capacitors of memory cells. This exploits the fact that ferroelectric dielectrics have a hysteresis, so that with the presence of voltage "zero" information can be permanently stored in accordance with the two polarization states that are present.

In order to switch the polarization and thus also the information from one state to the other state, a certain minimum voltage, the so-called coercive voltage Vc, must be applied to the capacitor.

SUMMARY OF THE INVENTION

It is accordingly an object of the invention to provide a FeRAM configuration with the smallest possible space requirement per memory cell, and in which the least possible space is required for storing a bit.

In the case of an FeRAM configuration of the type mentioned in the introduction, this object is achieved according to the invention by virtue of the fact that the capacitor device includes at least two capacitors whose coercive voltages differ from one another.

With the foregoing and other objects in view there is provided, in accordance with the invention a FeRAM configuration having a plurality of memory cells. Each one of the plurality of memory cells includes: a selection transistor; a capacitor device including at least two capacitors; and a common storage node connection connecting the at least two capacitors to the selection transistor. Each one of the at least two capacitors has a coercive voltage differing from others of the at least two capacitors, and each one of the at least two capacitors includes a ferroelectric dielectric.

The invention thus takes a completely different path from the prior art: instead of making a FeRAM memory cell with a selection transistor and a (storage) capacitor to be as small as possible by specific technological measures, as would intrinsically be expected, a plurality of capacitors are assigned to each selection transistor. If a memory cell has, for example, one selection transistor and two capacitors, then it can store two bits. Compared with a conventional memory cell including a selection transistor and a capacitor with which one bit can be stored, the space requirement for storing a bit is thus practically halved since the novel memory cell takes up hardly any more area than the existing memory cell.

The FeRAM configuration according to the invention first exploits the fact that the coercive voltage of a capacitor depends on the material of the dielectric and also on the layer thickness thereof. By appropriately selecting the material and/or the layer thickness, it is then possible to assign to a selection transistor, capacitors having different coercive voltages. The capacitors are provided in parallel with one another, so that information can be written serially to these capacitors independently of one another or can be read serially from these capacitors independently of one another.

For a more detailed explanation, a memory cell having one selection transistor and two capacitors C1 and C2 shall be considered for this purpose. In this case, the capacitor C1 shall have a coercive voltage VC1 and the capacitor C2 a coercive voltage VC2, where VC1<VC2, which can be achieved by an appropriately choosing the material for the dielectrics and/or different layer thicknesses for the dielectrics.

In the course of writing information, first information is written to the capacitor C2 with a high voltage U, which is greater than VC2. During this writing operation, information possibly still present in the capacitor C1 is also destroyed. A lower voltage, lying between VC1 and VC2 is subsequently applied to the memory cell. Through this lower voltage, information is written to the capacitor C1, while the capacitor C2, however, is no longer switched. As a result, different information can be stored in the two capacitors C1 and C2.

When information is read from this memory cell, the procedure is reversed: first a low voltage, lying between VC1 and VC2, is applied to the memory cell. Through this low voltage, the capacitor C1 is switched, so that its polarization current can be measured and hence the stored polarization direction can be determined. A high voltage U, which is greater than VC2, is subsequently applied. As a result, the information is read from the capacitor C2 in a corresponding manner. The information can then readily be written back to the capacitors in accordance with the above procedure.

Although the FeRAM configuration according to the invention is slower than existing configurations due to the serial reading and writing, this disadvantage can nonetheless be accepted in many applications if a particularly small space requirement is sought.

In order to reinforce the above example, it is important in the case of the FeRAM configuration according to the invention that the ferroelectric dielectric of the capacitor C2 is not already subjected to polarization reversal to a large extent when a voltage of less than VC2 is applied. Small polarization losses are acceptable, however, since the capacitor C2 can only be influenced through two switching operations (writing and reading) by the capacitor C1. It shall be emphasized that if this precondition is fulfilled well, it is also possible to provide more than two capacitors with a "staggered" coercive voltage VC in a memory cell in order to store more than two bits per selection transistor.

Preferred dielectrics for the capacitors are $SrBi_2Ta_2O_9$ (SBT), $SrBi_2(Ta_{1-x}Nb_x)_2O_9$ (SBTN) or other SBT derivatives, $PbZr_{1-x}Ti_xO_3$ (PZT) or $PbZr_{1-x}Ti_xLa_yO_3$. Suitable layer thicknesses of the dielectric are about 30–250 nm, preferably approximately 180 nm. Pt, Ir, Ru, Pd or oxides thereof or $LaSrCoO_x$ or $LaSnO_x$ can be used for the electrodes of the capacitors.

The capacitors may have a common connection ("plug") with, if appropriate, common storage nodes. However, it is also possible for the capacitors to have different storage nodes and different common plates and to be isolated from one another by an intermediate insulating layer made, for example, of silicon dioxide. The storage node or nodes may also be connected to the selection transistor via a metal clip.

Other features which are considered as characteristic for the invention are set forth in the appended claims.

Although the invention is illustrated and described herein as embodied in a FeRAM configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
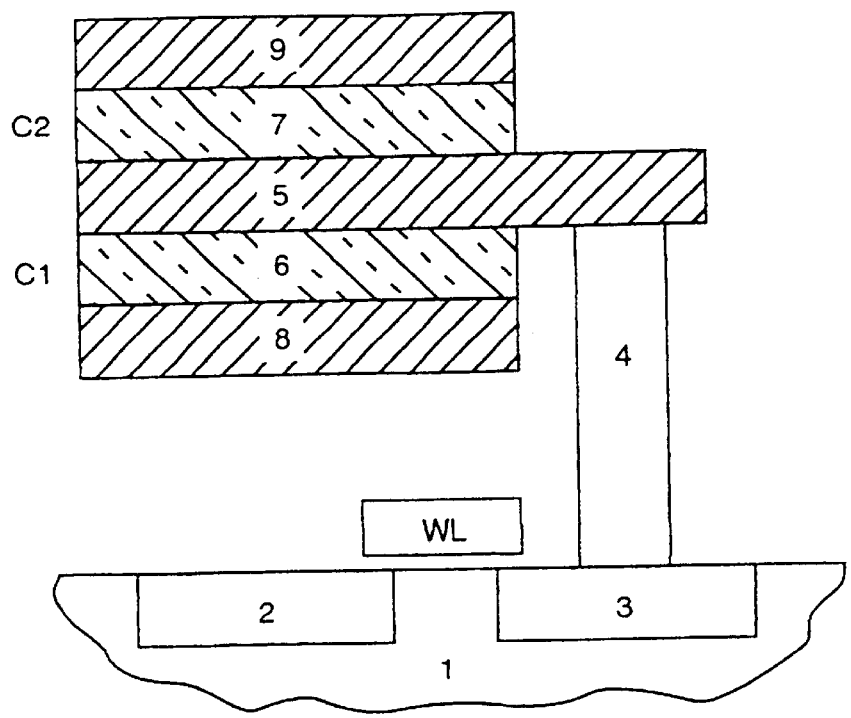
FIG. 1 shows a schematic sectional illustration of a first exemplary embodiment of the invention with a common storage node.

In the figures of the drawing, mutually corresponding parts are each provided with the same reference symbols. Moreover, insulating layers are not shown in order to improve the clarity. Referring now to the figures of the drawing in detail and first, particularly, to FIG. 1 thereof, there is diagrammatically shown a silicon semiconductor body 1, in which there is provided a selection transistor with source 2 and drain 3. A word line WL is guided between the source 2 and the drain 3 in an insulating layer (not shown) and is made, for example, of silicon dioxide. Drain 3 is connected via a common plug 4 made, for example, of metal, such as e.g. tungsten or aluminum, or doped polycrystalline silicon to a storage node 5 of two stacked capacitors C1, C2. The first stacked capacitor C1 includes a first common plate 8, a first dielectric 6 and the storage node 5, and the second stacked capacitor C2 includes a second common plate 9, a second dielectric 7 and the storage node 5. The plates 8, 9 can be connected to one another.

The dielectrics 6, 7 are chosen or configured in such a way that the coercive voltage VC1 of the capacitor C1 differs from the coercive voltage VC2 of the capacitor C2. As was explained in the introduction, this can be achieved by means of different layer thicknesses and/or different materials of the dielectrics 6, 7. Suitable materials are e.g. SBT, SBTN, PZT and PLZT, while an expedient layer thickness range is 30–250 nm, preferably about 180 nm. It goes without saying, however, that other layer thicknesses are also possible.

By way of example, given a voltage of 3 V and a layer thickness of 180 nm, SBT and SBTN (with a niobium proportion of 28%) have coercive voltages VC of 0.65 V (SBT) and 1 V (SBTN).

Suitable materials for the capacitor electrodes, that is to say the common plates 8, 9, and the storage node 5 are Pt, Pd, Rh, Au, Ir, Ru, oxides thereof, $LaSrCoO_x$ and $LaSuO_x$.

Another possible variant is one in which a common plate (such as the storage node 5) is provided in the "center" of the stack and two storage nodes (corresponding to the plates 8, 9) are connected to the plug 4.

The specified materials apply to all the exemplary embodiments.

Figure 2:
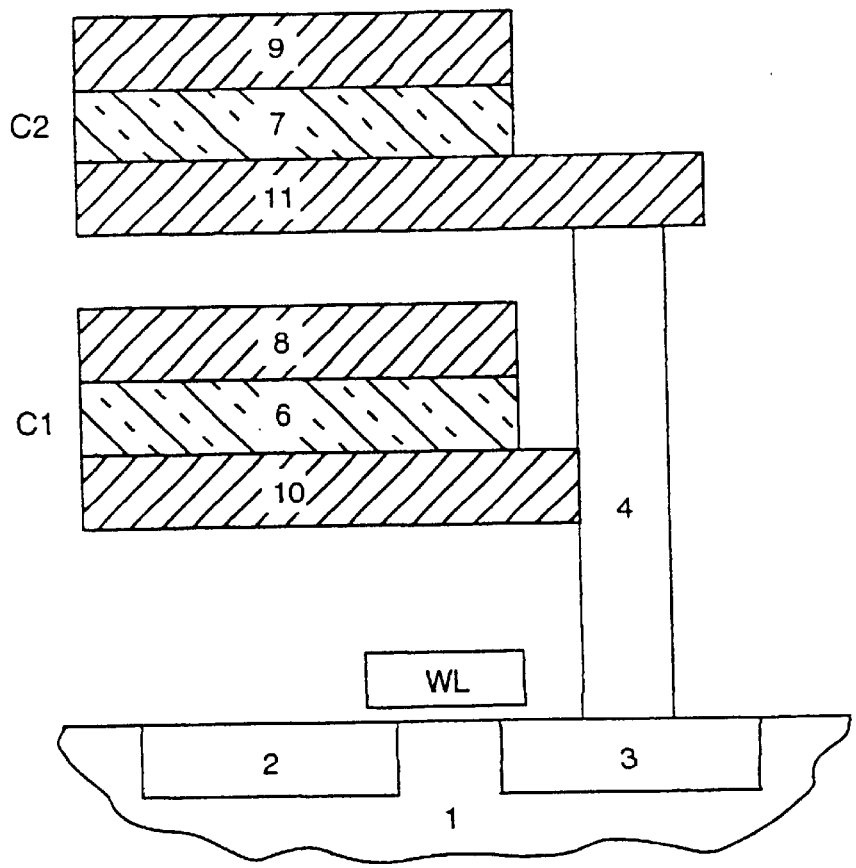
FIG. 2 shows a schematic sectional illustration of a second exemplary embodiment of the invention with separate storage nodes and separate common plates.

FIG. 2 shows an exemplary embodiment in which the two capacitors C1, C2 have different storage nodes 11, 12, which are connected to the plug 4, and also have plates 8, 9. In this case, the capacitors are isolated from one another by an insulating layer (not specifically illustrated) made, for example, of silicon dioxide.

Figure 3:
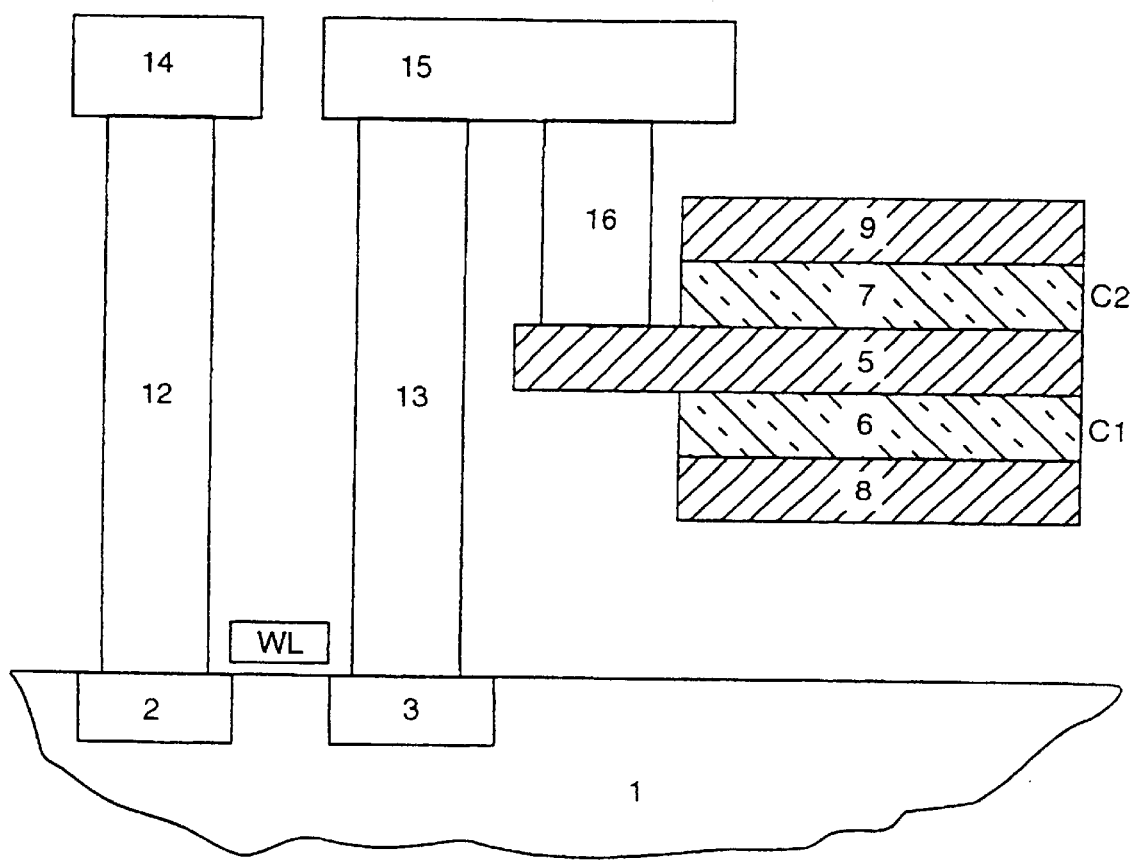
FIG. 3 shows a schematic sectional illustration of a third exemplary embodiment of the invention with a metal clip between a common storage node of the capacitors and the selection transistor.

FIG. 3 shows an exemplary embodiment in which a common storage node 5 is connected to drain 3 via a metal clip made of a plug 16 (for example made of doped polycrystalline silicon or aluminum). A contact 12 (made of the same material as contact 13) to a bit line 14 is additionally illustrated here. The capacitors C1, C2 of this exemplary embodiment can also be modified in the manner explained above for the variant with regard to FIG. 1 and for the exemplary embodiment of FIG. 2.

We claim:

1. A FeRAM configuration having a plurality of memory cells, each one of the plurality of memory cells comprising:
    a selection transistor;
    a capacitor device including at least two capacitors stacked on top of each other, each one of said at least two capacitors having a coercive voltage differing from that of others of said at least two capacitors, each one of said at least two capacitors including a ferroelectric dielectric; and
    a common storage node connection connecting said at least two capacitors to said selection transistor.

2. The FeRAM configuration according to claim 1, wherein said dielectric of a first one of said at least two capacitors is made from a first material and said dielectric of a second one of said at least two capacitors is made from a second material that is different from said first material.

3. The FeRAM configuration according to claim 2, wherein said first material and said second material are selected from the group consisting of $SrBi_2Ta_2O_9$(SBT), $SrBi_2(Ta_{1-x}Nb_x)_2O_9$ (SBTN), other SBT derivatives, $PbZr_{1-x}Ti_xO_3$ (PZT), and $PbZr_{1-x}Ti_xLa_yO_3$.

4. The FeRAM configuration according to claim 1, wherein said dielectric of a first one of said at least two capacitors has a first layer thickness and said dielectric of a second one of said at least two capacitors has a second layer thickness that is different from said first layer thickness.

5. The FeRAM configuration according to claim 1, wherein said dielectric of a first one of said at least two capacitors has a layer thickness from approximately 30 nm to 250 nm, and said dielectric of a second one of said at least two capacitors has a layer thickness from approximately 30 nm to 250 nm.

6. The FeRAM configuration according to claim 5, wherein said layer thickness of said first one of said at least two capacitors is approximately 180 nm, and said layer thickness of said second one of said at least two capacitors is approximately 180 nm.

7. The FeRAM configuration according to claim 1, wherein said at least two capacitors include electrodes made from a material selected from the group consisting of Pt, Pd, Rh, Au, Ir, Ru, oxides thereof, $LaSrCoO_x$, and $LaSnO_x$.

8. The FeRAM configuration according to claim 1, wherein said at least two capacitors share a common storage node.

9. The FeRAM configuration according to claim 8, comprising a metal clip connecting said common storage node to said selection transistor.

10. The FeRAM configuration according claim 1, wherein each one of said at least two capacitors includes a respective storage node and a respective common plate and said capacitor device includes an intermediate insulating layer isolating said at least two capacitors from one another.

11. The FeRAM configuration according to claim 10, comprising a metal clip connecting each said respective storage node to said selection transistor.

12. The FeRAM configuration according to claim 1, comprising a common plug connected to each one of said at least two capacitors.

* * * * *

UNITED STATES PATENT AND TRADEMARK OFFICE
CERTIFICATE OF CORRECTION

PATENT NO. : 6,438,019 B2
DATED : August 20, 2002
INVENTOR(S) : Walter Hartner et al.

It is certified that error appears in the above-identified patent and that said Letters Patent is hereby corrected as shown below:

<u>Title page,</u>
Item [30], should read as follows:

-- Foreign Application Priority Data

Jul. 8, 1998    (DE) . . . . . . . . . . . . . . . . . . 198 30 569.9 --

Signed and Sealed this

Twenty-ninth Day of October, 2002

Attest:

JAMES E. ROGAN
Attesting Officer
Director of the United States Patent and Trademark Office